(12) United States Patent
Lightle et al.

(10) Patent No.: US 8,849,587 B1
(45) Date of Patent: Sep. 30, 2014

(54) SYSTEM AND METHOD FOR REMOTELY MONITORING THE HEALTH OF A TRANSFORMER

(76) Inventors: Neal Fredrick Lightle, Estherville, IA (US); John Francis Jansen, Knoxville, TN (US)

(*) Notice: Subject to any disclaimer, the term of this patent is extended or adjusted under 35 U.S.C. 154(b) by 477 days.

(21) Appl. No.: 13/337,371

(22) Filed: Dec. 27, 2011

Related U.S. Application Data

(60) Provisional application No. 61/452,467, filed on Mar. 14, 2011.

(51) Int. Cl.
| G06F 19/00 | (2011.01) |
| G01R 23/00 | (2006.01) |
| G01R 31/02 | (2006.01) |
| G01H 1/00 | (2006.01) |

(52) U.S. Cl.
CPC ............. *G01R 31/027* (2013.01); *G01H 1/003* (2013.01)
USPC ............... 702/34; 340/646; 340/683; 702/56; 702/75

(58) Field of Classification Search
CPC ..... G01H 1/003; G01H 17/00; G01R 31/027; H01F 27/402; H01F 2027/406; B02C 7/11; B02C 23/04; D21D 1/30; D21D 1/002
USPC ........... 702/34, 35, 48, 54, 56, 75, 76, 77, 90, 702/103, 106, 183, 184, 185, 188; 324/547; 340/646, 683; 416/61; 714/799
See application file for complete search history.

(56) References Cited

U.S. PATENT DOCUMENTS

| 4,233,600 | A * | 11/1980 | Rogers et al. ................. 340/683 |
| 6,785,637 | B1 | 8/2004 | Wobben |
| 6,966,754 | B2 | 11/2005 | Wobben |
| 2004/0236538 | A1 | 11/2004 | Wobben |
| 2010/0102976 | A1* | 4/2010 | Lee et al. ...................... 340/646 |
| 2011/0031980 | A1 | 2/2011 | Kruger et al. |
| 2011/0055669 | A1 | 3/2011 | Dehaan et al. |

* cited by examiner

*Primary Examiner* — John H Le
(74) *Attorney, Agent, or Firm* — Jason R. Sytsma; Shuttleworth & Ingersoll, PLC

(57) ABSTRACT

A method for determining the health of a transformer through vibration measurement is disclosed. A vibratory signal, in the form of a physical mechanical vibration or auditory signal, is received at a sensor. The vibratory signal is converted into a frequency representation of the signal to derive its harmonics. Based on the power level for the harmonics in the vibratory signal, the harmonic current ratios in the transformer are calculated. The harmonic current ratios are summed together to quantify the health of the transformer. This value is called a K-factor, and is a quantification of the health of the transformer.

26 Claims, 4 Drawing Sheets

SYSTEM AND METHOD FOR REMOTELY MONITORING THE HEALTH OF A TRANSFORMER

This application claims priority to U.S. Provisional Application No. 61/452,467 filed Mar. 14, 2011, the entirety of which is incorporated by reference herein.

BACKGROUND

Transformers found in wind power or wind turbine installations are often subjected to strong physical and electrical stresses in the form of high load currents or internal or external short circuits. Damage can occur between individual windings or within one winding from overloading or insulation aging. This damage can have serious consequences for the operational reliability of the transformer.

As an example, inspecting a transformer in a wind turbine entails considerable down time. The wind turbine must be de-energized and a power quality monitor must be hardwired into the transformer. By de-energizing the transformer, the disturbed state of the energized transformer will be changed and it is possible that the re-energized state may not characterize the problematic state that was present before the transformer was taken offline. Furthermore, a hardwired power quality monitor requires a technician to physically manipulate the monitor, as well as start the monitor's recording function after the transformer is repowered and the wind turbine is on-line. This places personnel at considerable risk due to their presence within the danger zone where arc flashes can occur.

A solution is needed for remotely monitoring the health of a transformer in order to reduce the expense of taking a wind turbine off line and exposing technicians to dangerous conditions.

SUMMARY

According to the present invention, a method is provided for determining the health of a transformer through vibration measurement. A vibratory signal, in the form of a physical mechanical vibration or auditory signal, is received at a sensor. The vibratory signal is converted into a frequency representation of the signal to derive its harmonics. Based on the power level for the harmonics in the vibratory signal, the magnitude of the harmonic current ratios in the transformer are calculated. The square of the magnitude of the harmonic current ratios are summed together to quantify the health of the transformer. This value is called a K-factor, and is a quantification of the health of the transformer.

In another embodiment, a system is provided for measuring the health of a transformer. A sensor is used to detect a vibratory signal emanating from the transformer. A processor, in communication with the sensor, is configured to derive from the vibratory signal a current for each of a plurality of harmonic frequencies in the transformer and to determine the health of the transformer from a summation of the current ratios at each of the harmonic frequencies. The system can use analog preprocessing to enhance the detected signal as well as an analog-to-digital converter in communication with the detector to convert the vibratory signal into a digital representation of the signal. The processor can be further configured to convert the digital representation of the signal into a frequency spectrum representation of that signal in order to derive its frequency components. The square of the magnitude of the harmonic current ratios are summed together to quantify the health of the transformer. This value is called a K-factor, and is a quantification of the health of the transformer.

Other features and aspects of the invention will become apparent upon review of the following description taken in connection with the accompanying drawings. The invention, though, is pointed out with particularity by the appended claims.

DETAILED DESCRIPTION

Disclosed is a system for quantifying the health of a transformer through remote monitoring of its vibratory or acoustical signature. Transformers emit an acoustical "hum" due to a phenomenon called magnetostriction that is an inherent property of ferromagnetic materials. Magnetostriction causes such materials to change their shape or dimensions during the process of magnetization. This property can be quantified by the magnetostrictive coefficient which is the fractional change in length as the magnetization of the material increases from zero to the saturation value and will vibrate at a frequency twice the electrical current frequency that is flowing through the transformer. This dimensional change causes a mechanical vibration to be coupled to the physical structure of the transformer and associated equipment. These mechanical vibrations can also be coupled to air creating audible signals. The effect produces the acoustical "hum" that can be heard near the transformer (depending on the country, either 100 (=2*50) or 120 (=2*60) hertz, plus harmonics).

Figure 1:
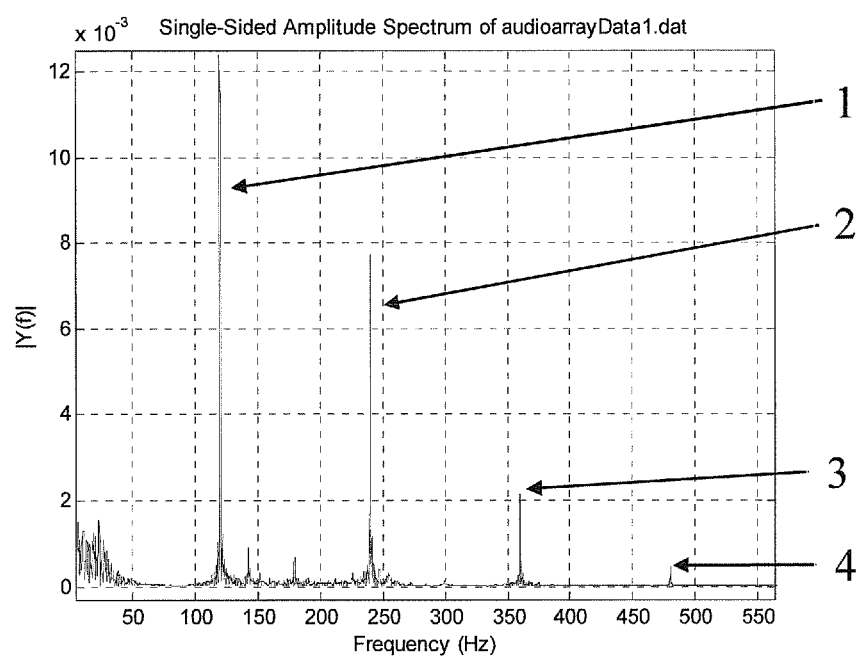
FIG. 1 is a graph of a power spectrum of acoustical noise emanating from a transformer.

FIG. 1 shows a typical plot of the power spectrum of the acoustic signal emitted from a transformer 102 for a nominal 60 Hz electric power system. The spectrum signal is obtained via fast Fourier transform (FFT); however, it can be obtained from any other Fourier series decomposition technique or other methods for signal analysis. The x-axis represents a range of frequencies from 0-550 Hz (for other cases this value would be different) and the y-axis represents the power level. The spikes on the graph represent the measured acoustic power level at various frequencies. Numeral 1 indicates a power spike at 120 Hz, numeral 2 indicates a power spike at 240 Hz, numeral 3 indicates a power spike at 360 Hz, and numeral 4 indicates a power spike at 480 Hz. Each of the acoustic power spikes is at distinct multiple of the acoustic fundamental frequency of 120 Hz (for a 60 Hz electric power system and would be a multiple of 100 Hz for a 50 Hz system).

An increase or a decrease in the power at the fundamental and harmonic frequencies is related to a rise or fall of power quality within transformer 102. Using modern power spectral density (PSD) and frequency decomposition methods (such as Fourier series techniques) found in numerous commercial software packages (such as MatLab® by Math Works or LabView® by National Instruments), the acoustical signal can be mapped, processed, and represented as a decomposition of the frequency components. The harmonic current components that generate the measured acoustic signal for this example are shown in FIG. 1 and are listed in Table 1.

TABLE 1

| Acoustic Frequency | Current Frequency |
|---|---|
| 120 Hz = | 60 Hz + 60 Hz |
|  | 180 Hz − 60 Hz |
|  | 300 Hz − 180 Hz |
|  | 420 Hz − 300 Hz |
| 240 Hz = | 180 Hz + 60 Hz |
|  | 300 Hz − 60 Hz |
|  | 420 Hz − 180 Hz |
| 360 Hz = | 300 Hz + 60 Hz |
|  | 420 Hz − 60 Hz |
| 480 Hz = | 420 Hz + 60 Hz |
|  | 300 Hz + 180 Hz |

Table 1 shows the mapping of the acoustic noise to electrical current flowing through transformer 102. The harmonic currents that generate the acoustics shown in FIG. 1 are shown in column 2 of Table 1. The amplitude of the acoustics is derived from the graph shown in FIG. 1, and is represented by $A_X$ where A is the amplitude of the acoustical signal and the subscript x is the acoustical frequency. Thus, $A_{120}$ equals the amplitude of the acoustical signal at 120 Hz, $A_{240}$ equals the amplitude of the acoustical signal at 240 Hz, and so on. Due to the periodicity of the acoustic signal, the current at the various harmonic frequencies flowing through the transformer is related to the acoustical signal by a sum of its harmonic components as shown in Eq. 1.

$$A_{120}\cos(2\pi 120t+\phi_{120})+A_{240}\cos(2\pi 240t+\phi_{240})+A_{360}\cos(2\pi 360t+\phi_{360})+A_{480}\cos(2\pi 480t+\phi_{480})=Z_A[I_1\cos(2\pi 60t+\phi_1)+I_3\cos(2\pi 180t+\phi_1)+I_5\cos(2\pi 300t+\phi_1)+I_7\cos(2\pi 420t+\phi_1)]^2 \qquad \text{Eq. 1}$$

Eq. 1 shows the acoustical signal measured by the sensor is related to the square of the electrical current flowing through the transformer due to the magnetostrictive phenomenon. The acoustical signal is equal to the acoustical impedance ($Z_A$) multiplied by the square of the current (I). The value for the acoustical impedance $Z_A$ is related to the placement of the sensor in terms of geometry and distance from the transformer, the material properties of the transformer and sensor, and atmospheric conditions. $Z_A$ is an impedance operator that blocks the DC components on the right-hand side of Eq. 1 from being transmitted through either the air or the mechanical structure and can attenuate the higher frequency components. The current (I) is the magnitude of a current amplitude at a harmonic and the subscript represents the harmonic index, for example $I_1$=the amplitude of the current at the first harmonic, i.e. 60 Hz, $I_3$=the amplitude of the current at the third harmonic, i.e. 180 Hz, $I_5$=the amplitude of the current at the fifth harmonic, i.e. 300 Hz, and $I_7$=amplitude of the current at the seventh harmonic, i.e., 420 Hz. While theoretically there could be an infinite number of harmonics, for the example based on FIG. 1 the first, third, fifth and seventh harmonic with respect to the electrical current harmonics were measured indicating that only a few harmonics are typically present which can simplify the problem of estimating the current magnitudes based on the acoustic or vibrational measurements.

Using FIG. 1 as an example, and assuming that the 60 Hz electrical current component is the dominate current magnitude and that the acoustic impedance is approximately the same for each harmonic, a few simplifying relationships can be readily determined. If the terms in Eq. 1 are expanded out and only terms that have the first harmonic current associated with them are kept, each of the acoustic signals can be paired with their associated current expression as follows:

$$A_{120}\cos(2\pi 120t+\varphi_{120}) \cong \frac{Z_A I_1^2}{2}\cos[2(2\pi 60t+\varphi_1)] \qquad \text{Eq. 2}$$

$$A_{240}\cos(2\pi 240t+\varphi_{240}) \cong \qquad \text{Eq. 3}$$
$$Z_A I_3 I_1 \cos[(2\pi 240t+\varphi_3+\varphi_1)] + Z_A I_5 I_1 \cos[(2\pi 240t+\varphi_5-\varphi_1)]$$

$$A_{360}\cos(2\pi 360t+\varphi_{360}) \cong Z_A I_5 I_1 \cos[(2\pi 360t+\varphi_5+\varphi_1)] + \qquad \text{Eq. 4}$$
$$Z_A I_7 I_1 \cos[(2\pi 360t+\varphi_7-\varphi_1)]$$

and $$A_{480}\cos(2\pi 480t+\varphi_{480}) \cong Z_A I_7 I_1 \cos[(2\pi 480t+\varphi_7+\varphi_1)] \qquad \text{Eq. 5}$$

For Eqs. 2-5, everything on the left-hand side of the equation can be estimated by using Fourier series based techniques. This means that acoustical amplitudes, $A_{120}$, $A_{240}$, $A_{360}$, and $A_{480}$, and the phase angles, $\phi_{120}$, $\phi_{240}$, $\phi_{360}$, and $\phi_{480}$, are calculated quantities from the sensor measurements. Typically, the phase angle at 120 Hz (i.e. $\phi_{120}$) is set as a zero reference point for all of the other signals, which forces the phase angle at the first harmonic (i.e. $\phi p_1$) in Eq. 2 to zero.

The unknown values in Eqs. 2-5 are the odd current harmonics, 3 through 7. Other harmonic combinations are possible and the method being presented can easily be adapted for other applications. These values are derived by finding the ratio of each current harmonic to the fundamental current. Eq. 2 provides the following relationship between $A_{120}$ and $I_1$:

$$A_{120} \cong \frac{Z_A}{2} I_1^2 \qquad \text{Eq. 6}$$

Eq. 5, provides the following relationship between $A_{480}$ and $I_7$, where $\phi_1=0$, $\phi_7=\phi_{480}$.

$$A_{480} \cong Z_A I_1 I_7 \qquad \text{Eq. 7}$$

By dividing Eq. 7 by Eq. 6, the ratio of the current at the seventh harmonic to the current at the fundamental frequency is as follows:

$$\frac{I_7}{I_1} = \frac{A_{480}}{2A_{120}} \qquad \text{Eq. 8}$$

The ratio of the seventh current harmonic to the fundamental current is one-half the ratio of the acoustic amplitude at 480 Hz to the acoustic amplitude at 120 Hz.

Dividing Eq. 4 by Eq. 6 obtains the following:

$$\frac{A_{360}}{A_{120}}\cos(2\pi 360t+\varphi_{360}) \cong \qquad \text{Eq. 9}$$
$$\frac{I_5}{I_1}\cos[(2\pi 360t+\varphi_5)] + \frac{I_7}{I_1}\cos[(2\pi 360t+\varphi_7)]$$

The ratio of the current at the fifth harmonic to the first harmonic can be found from Eq. 9 with some basic trigonometric manipulation to derive the following:

$$\frac{I_5}{I_1} = \qquad\qquad\text{Eq. 10}$$

$$\sqrt{\left[\frac{A_{360}}{A_{120}}\cos(\varphi_{360}) - \frac{I_7}{I_1}\cos(\varphi_7)\right]^2 + \left[\frac{A_{360}}{A_{120}}\sin(\varphi_{360}) - \frac{I_7}{I_1}\sin(\varphi_7)\right]^2}$$

$$\varphi_5 = \qquad\qquad\text{Eq. 11}$$

$$a\tan2\left(\frac{A_{360}}{A_{120}}\sin(\varphi_{360}) - \frac{I_7}{I_1}\sin(\varphi_7), \frac{A_{360}}{A_{120}}\cos(\varphi_{360}) - \frac{I_7}{I_1}\cos(\varphi_7)\right)$$

The ratio of the current at the third harmonic to the first harmonic can be found by dividing Eq. 3 by Eq. 6 to obtain:

$$\frac{A_{240}}{A_{120}}\cos(2\pi 240 t + \varphi_{240}) \cong \qquad\qquad\text{Eq. 12}$$

$$\frac{I_3}{I_1}\cos[(2\pi 240 t + \varphi_3)] + \frac{I_5}{I_1}\cos[(2\pi 240 t + \varphi_5)]$$

Eq. 12 can be modified with some basic trigonometric manipulations to obtain:

$$\frac{I_3}{I_1} = \sqrt{\left[\frac{A_{240}}{A_{120}}\cos(\varphi_{240}) - \frac{I_5}{I_1}\cos(\varphi_5)\right]^2 + \left[\frac{A_{240}}{A_{120}}\sin(\varphi_{240}) - \frac{I_5}{I_1}\sin(\varphi_5)\right]^2} \qquad\text{Eq. 13}$$

and $$\varphi_3 = a\tan2\left(\frac{A_{240}}{A_{120}}\sin(\varphi_{240}) - \frac{I_5}{I_1}\sin(\varphi_5), \frac{A_{240}}{A_{120}}\cos(\varphi_{240}) - \frac{I_5}{I_1}\cos(\varphi_5)\right) \qquad\text{Eq. 14}$$

In summary, the following magnitudes of the current ratios have been calculated: $I_7/I_1$ from Eq. 8, $I_5/I_1$ from Eq. 10, and $I_3/I_1$ from Eq. 13. The ratios of the harmonic to the fundamental currents (i.e. the current ratios) are used to quantify the health of transformer 102.

The health of transformer 102 can be quantified by determining its "K-factor", which is related to the magnitude of the current ratios at the various harmonics from the acoustical signal. K-factor is a value used to determine how much harmonic current a transformer can handle without exceeding its maximum temperature rise level. The K-factor values typically range from 1 to 50. A K-factor of 1 is used for linear loads only, and a K-factor of 50 is used for the harshest harmonic environment possible. Equation 15 derives the K-factor.

$$K = \sum_{h=1}^{n}\left(h\frac{I_h}{I_1}\right)^2 \qquad\text{Eq. 15}$$

Equation 15 shows the method of quantifying the health of a transformer by deriving its K-factor (K). The K-factor is a summation of the square of the current ratios multiplied by the harmonic number. For our present example, $$K = \sum_{h=1}^{n}\left(h\frac{I_h}{I_1}\right)^2 = 1 + \left(3\frac{I_3}{I_1}\right)^2 + \left(5\frac{I_5}{I_1}\right)^2 + \left(7\frac{I_7}{I_1}\right)^2 \qquad\text{Eq. 16}$$

where all the terms in Eq. 16 have been determined, and thus the K factor can be estimated from the acoustic signal.

The K-factor of the transformer is related to the sum of all of the current ratios at the harmonics. In most situations, the summation does not need to progress much further than a few harmonic orders. The derived K-factor for the transformer can be compared with the acceptable K-factor value for that transformer or changes in K-factor values to ascertain the health of the transformer.

Figure 2:
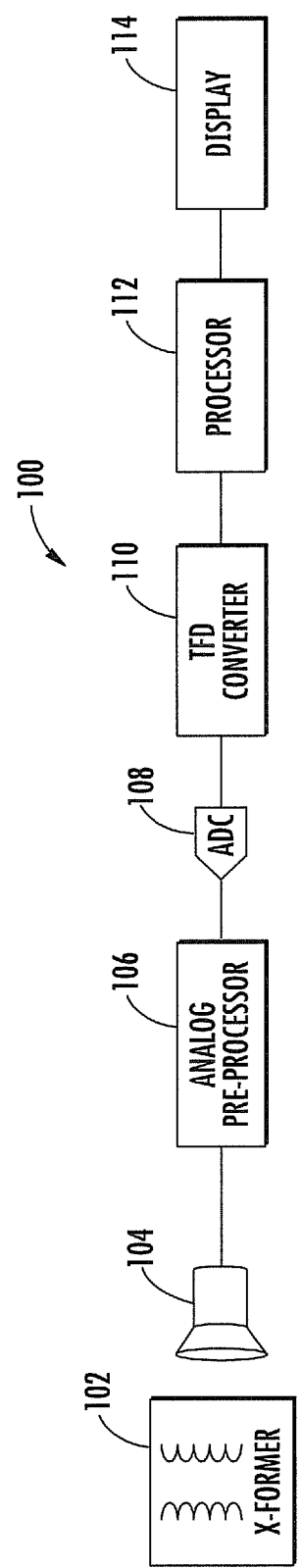
FIG. 2 is a high level block diagram of a system for remotely monitoring the health of a transformer in accordance with an embodiment of the invention.

FIG. 2 shows a system 100 for remotely monitoring the health of a transformer. A transformer 102 converts the electricity generated from the rotating turbine (typically at around 700 Volts for a wind turbine generator electrical system) into the appropriate voltage for the distribution system (typically 34.5 kV for a wind turbine generator electrical system). A sensor 104 detects a vibratory signal emanating from transformer 102 due to its magnetorestrictive properties. Sensor 104 can be a microphone, laser, accelerometer, strain gauge or other type of vibratory sensor that responds to acoustic pressure or vibration created by the flow of energy through transformer 102. In the illustrated embodiment, sensor 104 can be a microphone placed near transformer 102. FIG. 2 also shows, in phantom, that a strain gauge or accelerometer 104b can be used to detect physical vibrations on transformer 102.

An analog preprocessor 106 preprocess the vibratory signal detected by microphone 104 before it is converted into a digital signal by an analog-to-digital converter 108. Analog preprocessor 106 can include any number of analog devices, a series of band-pass filters and amplifiers can further help define the vibratory signal and filter ambient acoustical signals, which may heterodyne onto the target signal. In addition, if the signal is very weak, other conventional signal processing equipment, such as a lock-in amplifier could be used to pull the signal out of the background noise.

Alternatively, analog preprocessor 106 can be omitted and the vibratory signal can be sufficiently enhanced through digital signal processing techniques, including digital filtering and amplification.

The digital representation of the vibratory signal is processed by a time-to-frequency domain (TFD) converter 110 to derive the frequency contents of the vibratory signal. TFD converter 110 is preprogrammed with instructions for performing a Fourier spectral analysis, such as an FFT, any other Fourier series decomposition technique, or both.

A processor 112 is provided for processing the spectral representation of the vibratory signal, calculating the ratio of harmonic currents at a plurality of harmonic frequencies, and calculating the K-factor for transformer 102. Using the methods discussed above, the current ratios, which are used to determine the K-factor in accordance with Equation 15. The processed signal can be displayed on a display device 114 that is connected directly to processor 112 or the processed signal can be transmitted over a network to a remote monitoring station and viewed on a display device.

The quantified health of transformer 102, as represented by the calculated K-factor, can be transmitted and used to alert operating staff of an adverse condition in various manners. For example, the signal representing the health of transformer 102 can be transmitted over a network, Wi-Fi, Cellular, Ethernet, etc. to a remote monitoring station to alert an operator.

Figure 3:
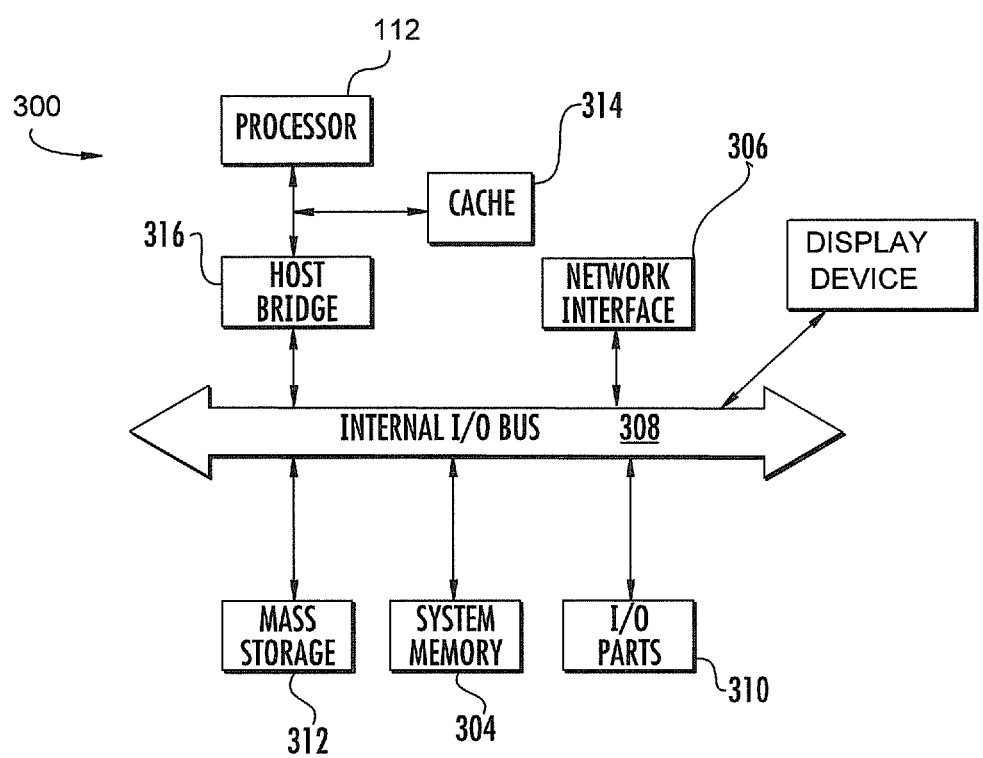
FIG. 3 is a functional block diagram illustrating hardware components of the processor of FIG. 2, according to various embodiments.

FIG. 3 shows an exemplary computing platform for executing the processing function necessary derive and calculate the above equations in order to quantify the health of transformer 102. In one implementation, a CPU 300 comprises a system including processor 112, a system memory 304, network interface 306 and one or more software applications and drivers enabling or implementing the methods and functions described herein. The hardware system includes a standard I/O bus 308 with I/O Ports 310 and mass storage 312 coupled thereto. Host bridge 316 couples processor 112 to I/O bus 308. The hardware system may further include video memory and display device 114 coupled to the video memory. Collectively, these elements are intended to represent a broad category of computer hardware systems, including but not limited to general-purpose computer systems based on the Pentium processor manufactured by Intel Corporation of Santa Clara, Calif., as well as any other suitable processor.

Elements of computer hardware system perform their conventional functions known in the art. In particular, network interface 306 is used to provide communication between CPU 300 and Ethernet networks (or any other network). Mass storage 312 is used to provide permanent storage for the data and programming instructions to perform the above described functions implementing the test to be carried, whereas system memory 304 (e.g., DRAM) is used to provide temporary storage for the data and programming instructions when executed by processor 112. I/O ports 310 are one or more serial and/or parallel communication ports used to provide communication between additional peripheral devices, such as ADC 108 and sensor 104.

Figure 4:
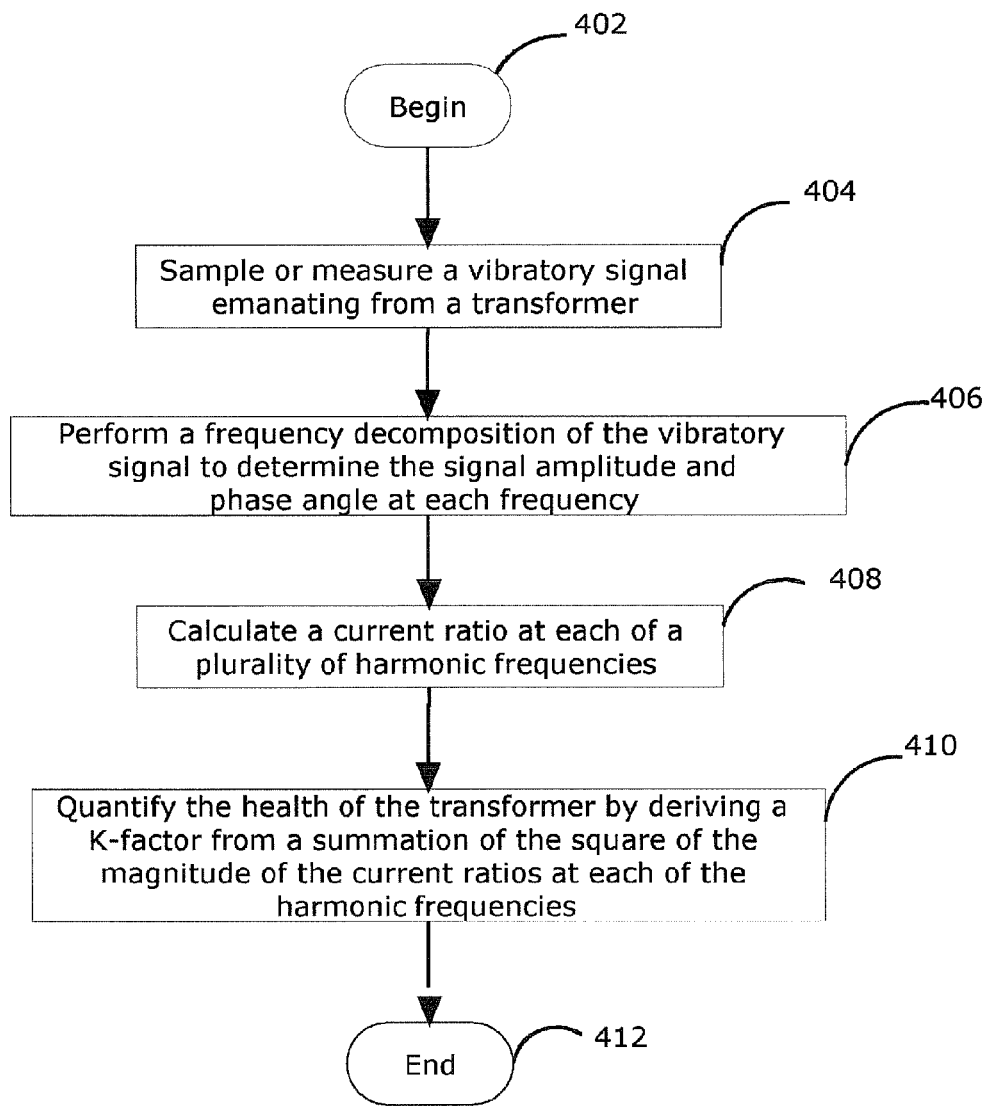
FIG. 4 is a flow chart for processing that can be used in systems and methods for remotely monitoring the health of a transformer, according to various embodiments.

CPU 300 may include a variety of system architectures, and various components of CPU 300 may be rearranged. For example, cache 314 may be on-chip with processor 112. Alternatively, cache 314 and processor 112 may be packed together as a "processor module," with processor 112 being referred to as the "processor core." Furthermore, certain implementations of the claimed embodiments may not require nor include all of the above components. Also, additional components may be included, such as additional processors, storage devices, or memories. FIG. 4 illustrates a flowchart of overall processing that can be used in systems and methods for determining the health of transformer 102 using acoustical or vibratory monitoring, according to various embodiments. In 402, processing can begin. In 404, one or more sensors 104 detect a vibratory signal, such as a vibration or acoustical noise emanating from transformer 102. As previously stated, sensor 104 can be microphones, lasers, accelerometers, strain gauge based sensors or other sensors that respond to the acoustic pressure or vibration created by the flow of energy through the transformer. In addition, multiple sensors 104 of the same or different type can also be used to provide redundancy, as well as confirmation of the vibratory signal from the transformer 102.

The detected vibratory signal is processed into a digital representation via an analog-to-digital conversion (ADC) chip, signal processor, or other hardware or software, to generate vibratory data. In 406, vibratory data is further processed by spectral analysis methods to derive the frequency content of the vibratory signal. In 408, processor 112 calculates a current flowing through transformer 102 at each of a plurality of harmonic frequencies in order to determine the magnitude of the current ratios. In 410, the square of he magnitude of the current ratios are summed together using the mathematical process in Eq. 15, above, to derive the K-factor for transformer 102, which represents the health of the transformer. In 412, processing can repeat or end.

The proposed invention uses the acoustical "hum" or the mechanical vibration of the transformer to determine its health. The system and method disclosed herein allows for the mobile, economical and safe monitoring of power transformers by wind energy and power transmission personnel and speeds up troubleshooting. It enables safe power quality monitoring, and increases system online times, while significantly reducing lost production revenues.

Reference has been made to several components throughout this disclosure as though each component is a unique component. The various systems, engines, and controllers can be incorporated into one or more other systems, engines, and controllers thereby reducing the number of components. For example, digital filter and signal condition as well as TFD converter 110 can reside in processor 112.

Reference may also have been made throughout this disclosure to "one embodiment," "an embodiment," or "embodiments" meaning that a particular described feature, structure, or characteristic is included in at least one embodiment of the present invention. Thus, usage of such phrases may refer to more than just one embodiment. Furthermore, the described features, structures, or characteristics may be combined in any suitable manner in one or more embodiments.

While the present invention has been particularly shown and described with reference to exemplary embodiments thereof, it should be understood by those of ordinary skill in the art that various changes, substitutions and alterations can be made herein without departing from the spirit and scope of the invention as embodied by the appended claims and their equivalents.

What is claimed is:

1. A method for determining a health of a transformer, comprising:
    measuring a vibratory signal from the transformer;
    deriving with a processor an acoustic power at a plurality of acoustic harmonic frequencies from the vibratory signal;
    calculating with the processor a current at each of a plurality of current harmonic frequencies in the transformer from the acoustical power at the corresponding acoustic harmonic frequencies;
    calculating with the processor a ratio of the current at each of the current harmonic frequencies to a current at a fundamental frequency; and
    determining with the processor the health of the transformer from the current at each of the plurality of current harmonic frequencies, wherein the health of the transformer is based on a K-factor, and further comprising calculating the K-factor for the transformer from a summation of a square of each of the ratios of the current at each of the current harmonic frequencies to the current fundamental frequency.

2. The method of claim 1, wherein the K-factor is determined by the following equation:

$$K = \sum_{h=1}^{n} \left(h\frac{I_h}{I_1}\right)^2$$

where K=the health of the transformer; h=the harmonic number; and I=the current at the $n^{th}$ harmonic number.

3. The method of claim 1, and further comprising calculating the current at each of the plurality of current harmonic frequencies in the transformer from the following equation:

$$A_{120}\cos(2\pi 120t+\phi_{120})+A_{240}\cos(2\pi 240t+\phi_{240})+A_{360}\cos(2\pi 360t+\phi_{360})+A_{480}\cos(2\pi 480t+\phi_{480})=Z_A[I_1\cos(2\pi 60t+\phi_1)+I_3\cos(2\pi 180t+\phi_1)+I_5\cos(2\pi 300t+\phi_1)+I_7\cos(2\pi 420t+\phi_1)]^2$$

where A is an amplitude of the vibratory signal and subscripts 120, 240, 360, and 480 correspond to a vibratory frequency, $Z_A$ is an vibratory impedance, I is a current amplitude and subscripts 1, 3, 5, and 7 correspond to a harmonic index, and $\phi$ represents a phase angle.

4. The method of claim 3, and further comprising expanding the equation in claim 3 and keeping only the terms that contain a first current harmonic, the equations are as follows:

$$A_{120}\cos(2\pi 120t + \varphi_{120}) \cong \frac{Z_A I_1^2}{2}\cos[2(2\pi 60t + \varphi_1)]$$

$$A_{240}\cos(2\pi 240t + \varphi_{240}) \cong$$
$$Z_A I_3 I_1 \cos[(2\pi 240t + \varphi_3 + \varphi_1)] + Z_A I_5 I_1 \cos[(2\pi 240t + \varphi_5 - \varphi_1)]$$

$$A_{360}\cos(2\pi 360t + \varphi_{360}) \cong$$
$$Z_A I_5 I_1 \cos[(2\pi 360t + \varphi_5 + \varphi_1)] + Z_A I_7 I_1 \cos[(2\pi 360t + \varphi_7 - \varphi_1)]$$

$$A_{480}\cos(2\pi 480t + \varphi_{480}) \cong Z_A I_7 I_1 \cos[(2\pi 480t + \varphi_7 + \varphi_1)].$$

5. The method of claim 4, and further comprising setting $\phi_{120}$ as a zero reference and $\phi_1$ equal to zero.

6. The method of claim 5, and further comprising calculating the ratio of the current at a third current harmonic to the current fundamental harmonic with the following equation:

$$\frac{I_3}{I_1} = \sqrt{\left[\frac{A_{240}}{A_{120}}\cos(\varphi_{240}) - \frac{I_5}{I_1}\cos(\varphi_5)\right]^2 + \left[\frac{A_{240}}{A_{120}}\sin(\varphi_{240}) - \frac{I_5}{I_1}\sin(\varphi_5)\right]^2}$$

7. The method of claim 6, and further comprising calculating the ratio of the current at a fifth current harmonic to the current fundamental harmonic with the following equation:

$$\frac{I_5}{I_1} = \sqrt{\left[\frac{A_{360}}{A_{120}}\cos(\varphi_{360}) - \frac{I_7}{I_1}\cos(\varphi_7)\right]^2 + \left[\frac{A_{360}}{A_{120}}\sin(\varphi_{360}) - \frac{I_7}{I_1}\sin(\varphi_7)\right]^2}$$

$$\varphi_5 = a\tan 2\left(\frac{A_{360}}{A_{120}}\sin(\varphi_{360}) - \frac{I_7}{I_1}\sin(\varphi_7), \frac{A_{360}}{A_{120}}\cos(\varphi_{360}) - \frac{I_7}{I_1}\cos(\varphi_7)\right).$$

8. The method of claim 7, and further comprising calculating the ratio of the current at a seventh current harmonic to the current fundamental harmonic with the following equation:

$$\frac{I_7}{I_1} = \frac{A_{480}}{2A_{120}}.$$

9. The method of claim 8, and further comprising converting the vibratory signal into a harmonic representation of the vibratory signal.

10. The method of claim 9, and further comprising converting the vibratory signal into a digital representation thereof before converting the vibratory signal into a frequency spectrum representation thereof.

11. The method of claim 10, wherein the vibratory signal is detected at a distance from the transformer.

12. The method of claim 8, determining the K-factor with the following equation:

$$K = \sum_{h=1}^{n}\left(h\frac{I_h}{I_1}\right)^2$$

where K=the health of the transformer; h=the harmonic number; and I=the current at the $n^{th}$ harmonic number.

13. The method of claim 12, wherein the vibratory signal is an acoustical signal emanating from the transformer.

14. A system for measuring a health of a transformer, the system comprising:
a sensor to detect a vibratory signal from the transformer; and
a processor in communication with the sensor and configured to decompose the vibratory signal to determine a vibratory harmonic contents of the vibratory signal and derive a current at each of a plurality of current harmonic frequencies in the transformer from the vibratory harmonic contents of the vibratory signal and calculating a ratio of the current at each of the current harmonic frequencies to a current fundamental frequency and determine a health of the transformer from a summation of a square of each of the ratios of the current at each of the current harmonic frequencies to the current fundamental frequency, wherein the processor is configured to derive the health of the transformer from a K-factor, which is calculated from the summation of the square of each of the ratios of the current at each of the current harmonic frequencies to the current fundamental frequency.

15. The system of claim 14, and further comprising an analog-to-digital converter in communication with the sensor to convert the vibratory signal into a digital representation thereof, wherein the processor is configured to convert the digital representation of the vibratory signal into a frequency representation thereof and calculate the ratio of the current at each of the current harmonic frequencies to a current fundamental frequency from the frequency representation of the digital representation of the vibratory signal.

16. The system of claim 15, wherein the sensor is an acoustical sensor.

17. The system of claim 15, wherein the vibratory signal is an acoustical signal.

18. The system of claim 17, and further comprising an analog preprocessor in communication with the sensor to modify the acoustical signal for digital signal processing by the analog-to-digital converter.

19. The system of claim 18, wherein the analog preprocessor further comprises a lock-in amplifier tuned to a frequency of interest for finding a magnitude and a phase angle for the frequency of interest.

20. The system of claim 14, wherein the processor is configured to calculate the current at each of the plurality of current harmonic frequencies in the transformer from the following equation:

$$A_{120}\cos(2\pi 120t+\phi_{120})+A_{240}\cos(2\pi 240t+\phi_{240})+A_{360}\cos(2\pi 360t+\phi_{360})+A_{480}\cos(2\pi 480t+\phi_{480})=Z_A[I_1\cos(2\pi 60t+\phi_1)+I_3\cos(2\pi 180t+\phi_1)+I_5\cos(2\pi 300t+\phi_1)+I_7\cos(2\pi 420t+\phi_1)]^2$$

where A is an amplitude of the vibratory signal and subscripts 120, 240, 360, and 480 correspond to a vibratory frequency in Hertz, $Z_A$ is an vibratory impedance, I is a current amplitude and subscripts 1, 3, 5, and 7 correspond to a harmonic index, and $\phi$ represents a phase angle.

21. The system of claim 20, wherein processor is configured to expand the equation in claim 20 and keep only the terms that contain a first current harmonic, the equations with the first current harmonic are as follows:

$$A_{120}\cos(2\pi 120 t + \varphi_{120}) \cong \frac{Z_A I_1^2}{2}\cos[2(2\pi 60 t + \varphi_1)]$$

$$A_{240}\cos(2\pi 240 t + \varphi_{240}) \cong Z_A I_3 I_1 \cos[(2\pi 240 t + \varphi_3 + \varphi_1)] + Z_A I_5 I_1 \cos[(2\pi 240 t + \varphi_5 - \varphi_1)]$$

$$A_{360}\cos(2\pi 360 t + \varphi_{360}) \cong Z_A I_5 I_1 \cos[(2\pi 360 t + \varphi_5 + \varphi_1)] + Z_A I_7 I_1 \cos[(2\pi 360 t + \varphi_7 - \varphi_1)]$$

$$A_{480}\cos(2\pi 480 t + \varphi_{480}) \cong Z_A I_7 I_1 \cos[(2\pi 480 t + \varphi_7 + \varphi_1)].$$

22. The system of claim 21, wherein $\phi_{120}$ is set as a zero reference and $\phi_1$ equals zero.

23. The system of claim 22, wherein the processor is configured to calculate the ratio of the current at a third current harmonic to the current fundamental harmonic with the following equation:

$$\frac{I_3}{I_1} = \sqrt{\left[\frac{A_{240}}{A_{120}}\cos(\varphi_{240}) - \frac{I_5}{I_1}\cos(\varphi_5)\right]^2 + \left[\frac{A_{240}}{A_{120}}\sin(\varphi_{240}) - \frac{I_5}{I_1}\sin(\varphi_5)\right]^2}$$

$$\varphi_3 = a\tan 2\left(\frac{A_{240}}{A_{120}}\sin(\varphi_{240}) - \frac{I_5}{I_1}\sin(\varphi_5), \frac{A_{240}}{A_{120}}\cos(\varphi_{240}) - \frac{I_5}{I_1}\cos(\varphi_5)\right).$$

24. The system of claim 23, wherein the processor is configured to calculate the ratio of the current at a fifth current harmonic to the current fundamental harmonic with the following equation:

$$\frac{I_5}{I_1} = \sqrt{\left[\frac{A_{360}}{A_{120}}\cos(\varphi_{360}) - \frac{I_7}{I_1}\cos(\varphi_7)\right]^2 + \left[\frac{A_{360}}{A_{120}}\sin(\varphi_{360}) - \frac{I_7}{I_1}\sin(\varphi_7)\right]^2}$$

-continued $$\varphi_5 = a\tan 2\left(\frac{A_{360}}{A_{120}}\sin(\varphi_{360}) - \frac{I_7}{I_1}\sin(\varphi_7), \frac{A_{360}}{A_{120}}\cos(\varphi_{360}) - \frac{I_7}{I_1}\cos(\varphi_7)\right).$$

25. The system of claim 24, wherein the processor is configured to calculate the ratio of the current at a seventh current harmonic to the current fundamental harmonic with the following equation:

$$\frac{I_7}{I_1} = \frac{A_{480}}{2A_{120}}.$$

26. The system of claim 25, wherein the processor is configured to calculate the K-factor from the following equation:

$$K = \sum_{h=1}^{n}\left(h\frac{I_h}{I_1}\right)^2$$

where K=the health of the transformer; h=the harmonic number; and I=the current at the $n^{th}$ harmonic number.

* * * * *